(12) United States Patent
Kim et al.

(10) Patent No.: US 11,776,917 B2
(45) Date of Patent: Oct. 3, 2023

(54) ELECTRONIC PACKAGE

(71) Applicant: Advanced Semiconductor Engineering Korea, Inc., Gyeonggi-Do (KR)

(72) Inventors: Seokbong Kim, Gyeonggi-Do (KR); Eunshim Lee, Gyeonggi-Do (KR)

(73) Assignee: ADVANCED SEMICONDUCTOR ENGINEERING KOREA, INC., Paju-si (KR)

( * ) Notice: Subject to any disclaimer, the term of this patent is extended or adjusted under 35 U.S.C. 154(b) by 45 days.

(21) Appl. No.: 16/931,366

(22) Filed: Jul. 16, 2020

(65) Prior Publication Data

US 2022/0020698 A1 Jan. 20, 2022

(51) Int. Cl.
| | |
|---|---|
| *H01L 23/552* | (2006.01) |
| *H01L 23/498* | (2006.01) |
| *H01L 23/31* | (2006.01) |
| *H01L 23/13* | (2006.01) |
| *H01L 23/00* | (2006.01) |
| *H01L 21/48* | (2006.01) |
| *H01L 23/367* | (2006.01) |

(52) U.S. Cl.
CPC ........ *H01L 23/552* (2013.01); *H01L 21/4846* (2013.01); *H01L 23/13* (2013.01); *H01L 23/3121* (2013.01); *H01L 23/3675* (2013.01); *H01L 23/49816* (2013.01); *H01L 23/49833* (2013.01); *H01L 24/16* (2013.01); *H01L 24/32* (2013.01); *H01L 24/48* (2013.01); *H01L 24/73* (2013.01); *H01L 2224/16225* (2013.01); *H01L 2224/32225* (2013.01); *H01L 2224/48225* (2013.01); *H01L 2224/73265* (2013.01); *H01L 2924/3025* (2013.01)

(58) Field of Classification Search
CPC .................. H01L 23/552; H01L 23/49833
See application file for complete search history.

(56) References Cited

U.S. PATENT DOCUMENTS

| | | | | |
|---|---|---|---|---|
| 7,638,868 | B2* | 12/2009 | Haba | H01L 23/3157 |
| | | | | 257/E23.169 |
| 9,786,572 | B1* | 10/2017 | Beaumier | H01L 23/552 |
| 10,388,637 | B2 | 8/2019 | Kim et al. | |
| 2001/0020545 | A1* | 9/2001 | Eldridge | G01R 1/07378 |
| | | | | 174/260 |
| 2004/0231872 | A1* | 11/2004 | Arnold | H01L 23/49838 |
| | | | | 174/377 |
| 2011/0210444 | A1* | 9/2011 | Jeng | H01L 24/97 |
| | | | | 257/E23.173 |
| 2012/0000699 | A1* | 1/2012 | Inoue | H01L 23/29 |
| | | | | 174/257 |

(Continued)

OTHER PUBLICATIONS

Definition of "through", http://www.dictionary.com (2021) (Year: 2021).*

*Primary Examiner* — Michele Fan
(74) *Attorney, Agent, or Firm* — FOLEY & LARDNER LLP

(57) ABSTRACT

The present disclosure provides an electronic package and method of manufacturing the same. The electronic package includes an electronic device including a first carrier and a first electronic component disposed on the first carrier, a second carrier adjacent to the first carrier of the electronic device, and a conductive layer at least partially covering the electronic device, and separating the electronic device from the second carrier.

5 Claims, 18 Drawing Sheets

(56) References Cited

U.S. PATENT DOCUMENTS

| | | | | |
|---|---|---|---|---|
| 2016/0365333 A1* | 12/2016 | Hohlfeld | .................. | H01L 23/36 |
| 2018/0158768 A1* | 6/2018 | Kim | .................... | H01L 21/4803 |
| 2018/0182745 A1* | 6/2018 | Ikeda | .................... | H01L 25/074 |
| 2018/0190601 A1* | 7/2018 | Hitomi | .................... | H03F 3/245 |
| 2019/0289758 A1* | 9/2019 | Furuya | .................. | H05K 5/065 |
| 2020/0344869 A1* | 10/2020 | So | .......................... | H01L 24/20 |

* cited by examiner

ELECTRONIC PACKAGE

BACKGROUND

1. Technical Field

The present disclosure relates to an electronic package and manufacturing method thereof, and more particularly, to an electronic package with a conductive lid for electromagnetic interference (EMI) shielding and thermal dissipation and manufacturing method thereof.

2. Description of the Related Art

As electronic package size gets smaller and smaller, heat accumulation and EMI issue become serious. With the development of 3D package in which electronic component and substrate are stacked in Z direction, heat accumulation and EMI issue become more critical.

SUMMARY

One aspect of the present disclosure relates to an electronic package. In some embodiments, an electronic package includes an electronic device including a first carrier and a first electronic component disposed on the first carrier, a second carrier adjacent to the first carrier of the electronic device, and a conductive layer at least partially covering the electronic device, and separating the electronic device from the second carrier.

Another aspect of the present disclosure relates to an electronic package. In some embodiments, an electronic package includes a first substrate, an electronic device, a second carrier and a conductive lid. The electronic device is disposed over the first substrate, wherein the electronic device includes a first carrier and a first electronic component disposed on the first carrier, and the electronic device includes an upper surface and a first edge. The second carrier is disposed over the first substrate, wherein the second carrier is adjacent to the first edge of the electronic device and apart from the first edge with a gap. The conductive lid is mounted on the first substrate. The conductive lid includes a cap covering the upper surface, and a first sidewall penetrating through the cap to cover the first edge of the electronic device.

Another aspect of the present disclosure relates to a method of manufacturing an electronic package. In some embodiments, the method includes the following operations. A first carrier and an electronic device adjacent to the first carrier are provided. The electronic device includes a second carrier and a first electronic component disposed on the second carrier. A conductive layer is formed to cover the electronic device to separate the electronic device from the first carrier.

BRIEF DESCRIPTION OF THE DRAWINGS

Aspects of some embodiments of the present disclosure are readily understood from the following detailed description when read with the accompanying figures. Various structures may not be drawn to scale, and the dimensions of the various structures may be arbitrarily increased or reduced for clarity of discussion.

DETAILED DESCRIPTION

Figure 1:
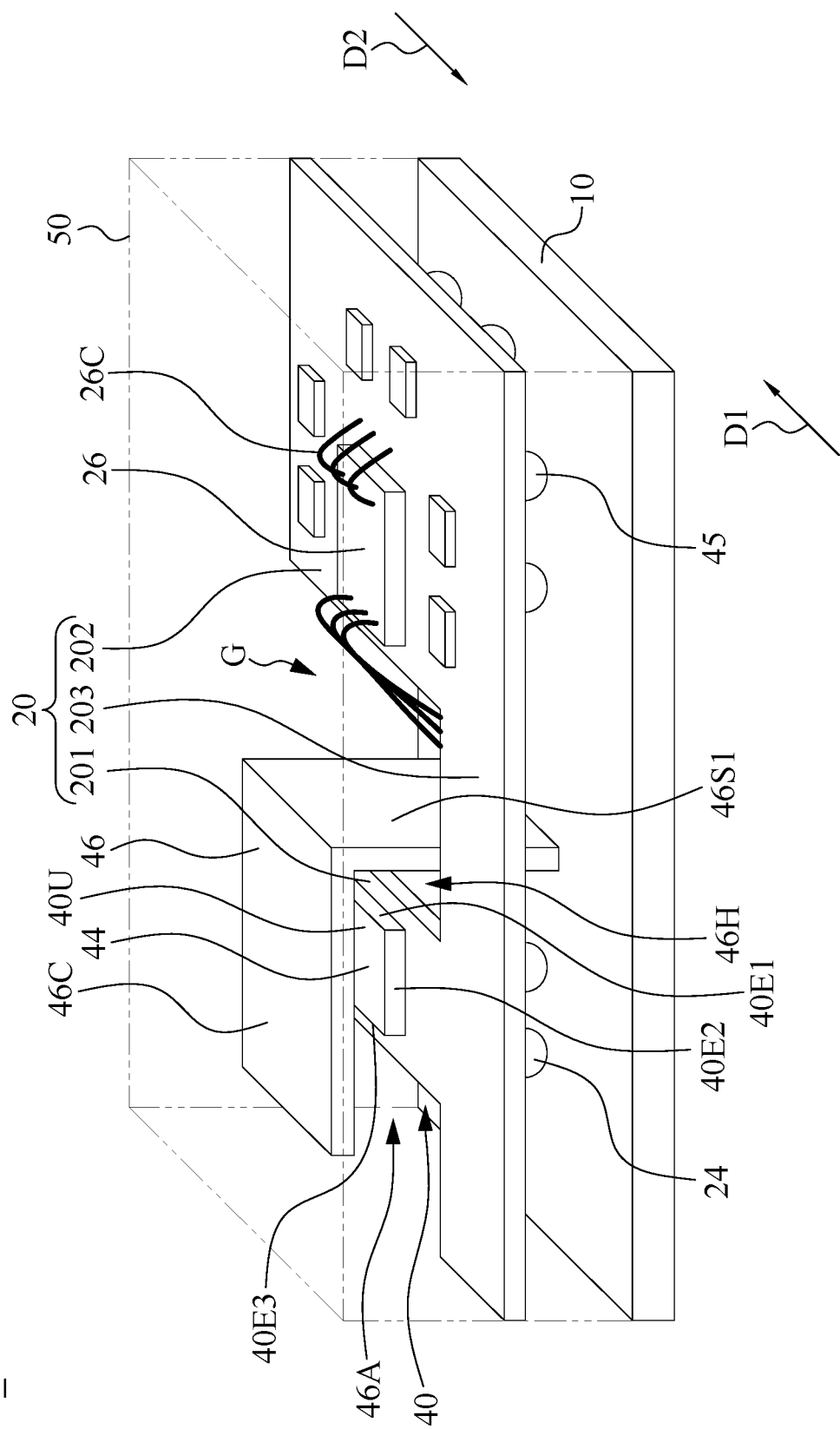
FIG. 1 is a schematic perspective view of an electronic package in accordance with some embodiments of the present disclosure.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features are formed or disposed between the first and second features, such that the first and second features are not in direct contact. In addition, the present disclosure may repeat reference numerals and/or letters in the various examples. This repetition is for the purpose of simplicity and clarity and does not in itself dictate a relationship between the various embodiments and/or configurations discussed.

As used herein, spatially relative terms, such as "beneath," "below," "above," "over," "on," "upper," "lower," "left," "right," "vertical," "horizontal," "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

In some embodiments of the present disclosure, an electronic package is equipped with a conductive layer such as a conductive lid for increasing EMI shielding and thermal dissipation effects. The electronic package may include a 3D package with a substrate such as a package substrate and an electronic device stacked in Z direction. The conductive layer may cover an upper surface and at least an edge of the electronic device. The conductive layer may be in thermally conductive contact with the upper surface of the electronic device to provide thermal dissipation effect. The conductive layer may be interposed between an electronic component of the electronic device and another electronic component of the electronic package to provide EMI shielding effect.

As used herein, the term "in thermally conductive contact" may be used to describe that one element is in direct contact with another element, or one element is in indirectly contact with another element through a medium including gas medium, liquid medium, solid medium or a combination thereof, which is thermally conductive. The thermally conductive contact allows heat transmitting from one element to another element mainly by heat conduction than by heat conduction, and thus heat transmission efficiency can be improved.

Figure 1A:
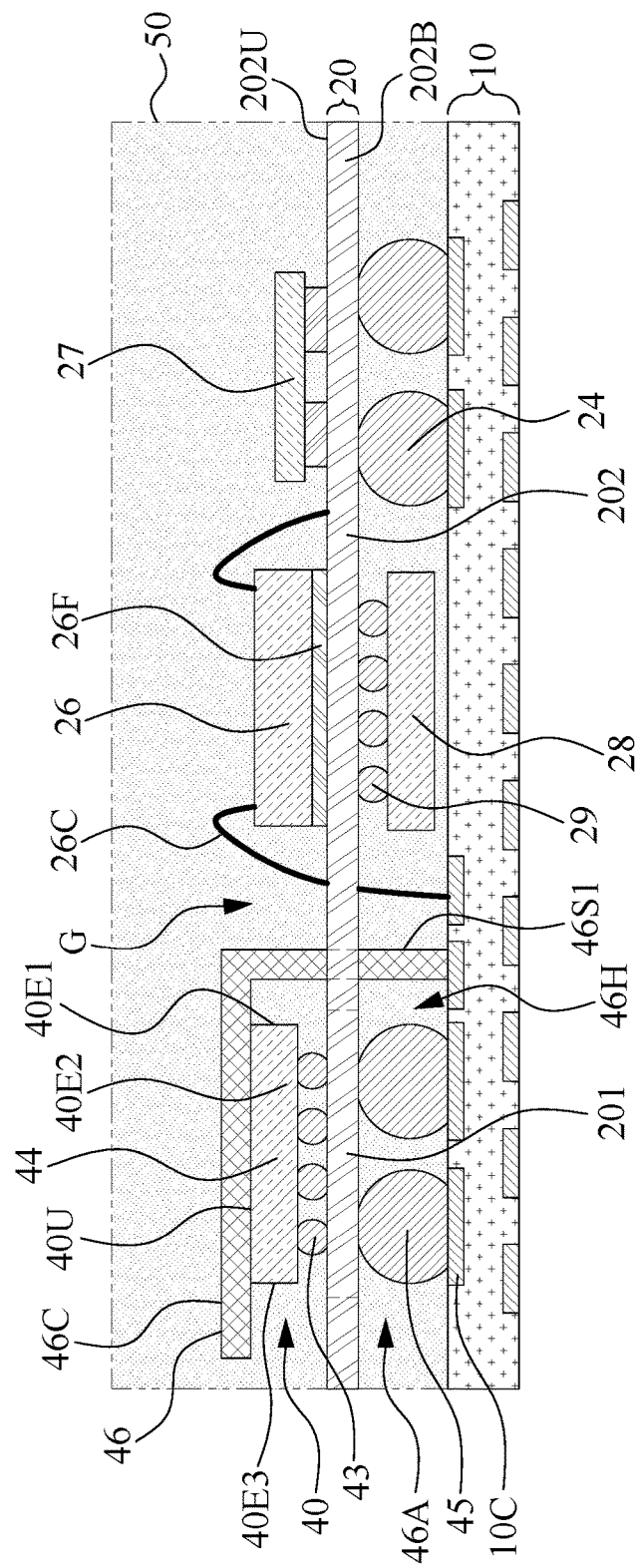
FIG. 1A is a schematic side view of the electronic package from a first direction D1 of FIG. 1.
Figure 1B:
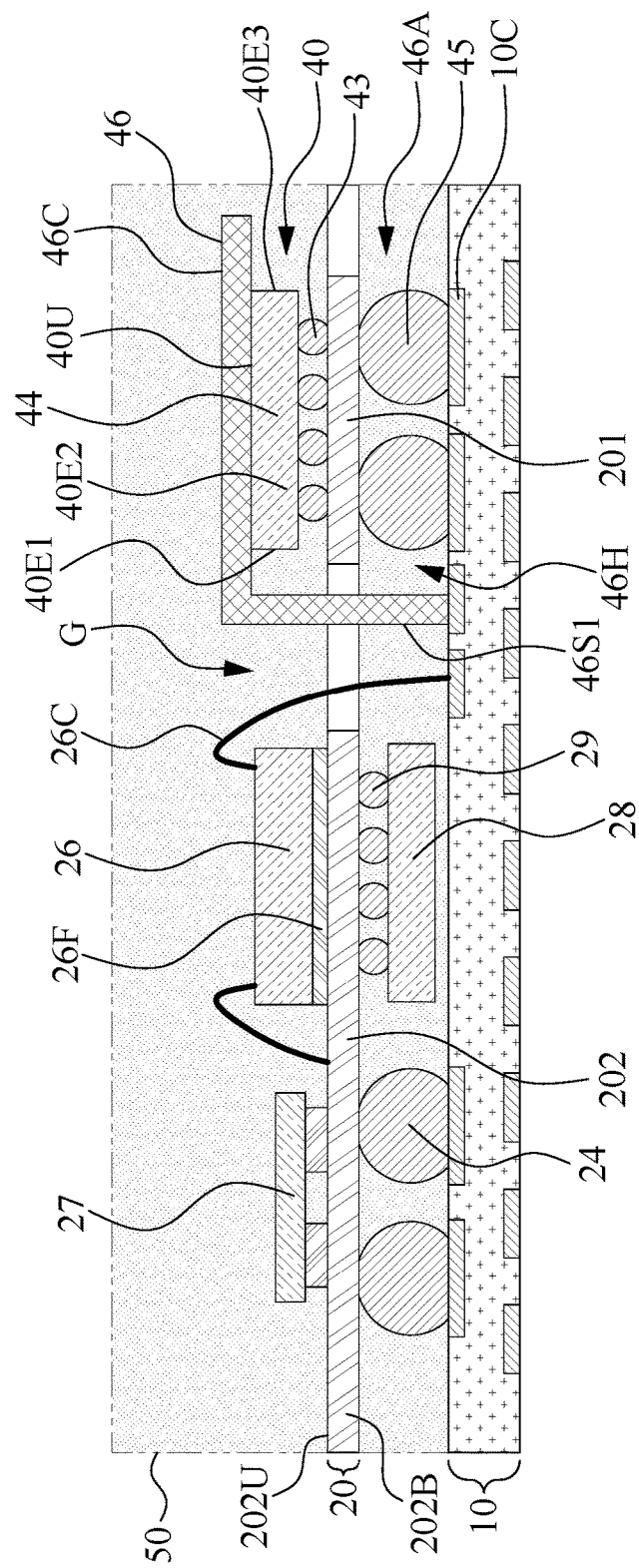
FIG. 1B is a schematic side view of the electronic package from a second direction D2 of FIG. 1.
Figure 1C:
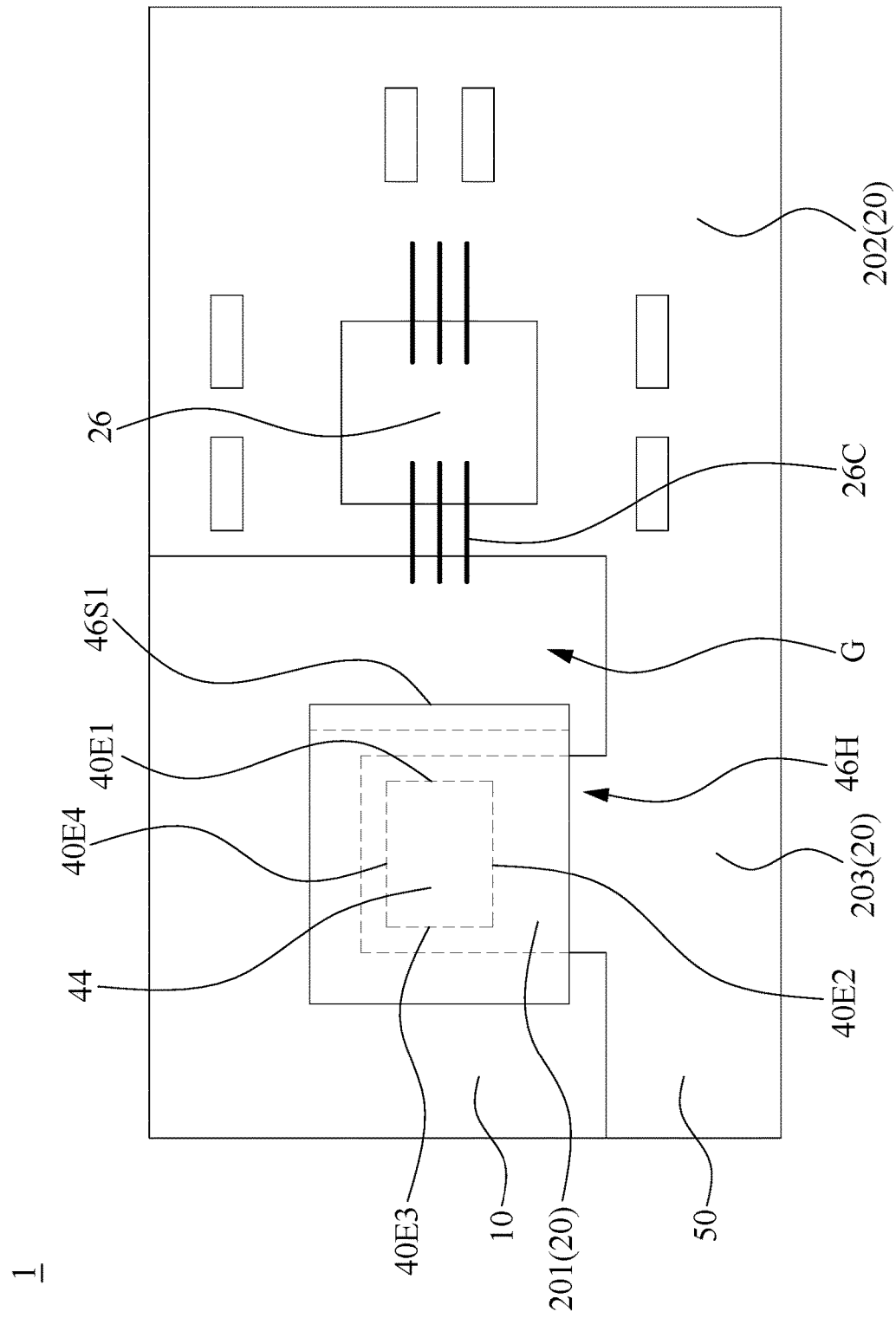
FIG. 1C is a schematic top view of the electronic package of FIG. 1.

FIG. 1 is a schematic perspective view of an electronic package 1 in accordance with some embodiments of the present disclosure, FIG. 1A is a schematic side view of the electronic package 1 from a first direction D1 of FIG. 1, FIG. 1B is a schematic side view of the electronic package 1 from a second direction D2 of FIG. 1, and FIG. 1C is a schematic top view of the electronic package 1 of FIG. 1. To highlight features of the electronic package 1, some component such as an encapsulant 50 is not drawn in FIG. 1C. As shown in FIG. 1, FIG. 1A, FIG. 1B and FIG. 1C, the electronic package 1 includes an electronic device 40 including a first carrier 201 and a first electronic component 44 disposed on the first carrier 201. The active surface of the first electronic component 44 may face the first carrier 201 or may be opposite to the first carrier 201. In some embodiments, the electronic device 40 may include electrical conductors 43 such as solder bumps, conductive pillars, a combination thereof or the like disposed between and electrically connected to the first electronic component 44 and the first carrier 201. In some other embodiments, the electrical conductors 43 may include bonding wires or the like. In some embodiments, the first electronic component 44 may include an active electronic component such as a system on chip (SOC), a high frequency IC such as a radio frequency (RF) IC, a memory component or other active electronic component. The first electronic component 44 may further include a passive component or a combination of active component and passive component.

The electronic package 1 may further include a second carrier 202 and a conductive layer 46. The second carrier 202 may be disposed adjacent to the first carrier 201 of the electronic device 40. The conductive layer 46 may at least partially cover the electronic device 40, and separate the electronic device 40 from the second carrier 202. The first carrier 201 and the second carrier 202 are separated by a gap G between the electronic device 40 and the second carrier 202. In some embodiments, the electronic device 1 may further include a first substrate 10 disposed under the first carrier 201 and the second carrier 202. The first substrate 10 may include a package substrate such as a core substrate or a coreless substrate with embedded circuitry 10C including conductive wires, conductive pads and/or conductive vias. The electronic device 40 may be disposed on and electrically connected to the first substrate 10. In some embodiments, the electronic device 40 may further include a plurality of electrical conductors (also referred to first electrical conductors) 45 disposed between and electrically connected to the first carrier 201 and the first substrate 10. The electrical conductors 45 may include solder bumps, conductive pillars, a combination thereof or the like. The electronic package 1 may further include a plurality of electrical conductors (also referred to second electrical conductors) 24 disposed between and electrically connected to the second carrier 202 and the first substrate 10. The electrical conductors 24 may include solder bumps, conductive pillars, a combination thereof or the like.

In some embodiments, the electronic package 1 may further include a second electronic component 26 disposed on an upper surface 202U of the second carrier 202, and electrical elements 26C for electrically connecting the second electronic component 26 to the first substrate 10 and/or the second substrate 20. The second electronic component 26 may include an active electronic component such as a system on chip (SOC), a high frequency IC such as a radio frequency (RF) IC, a memory component or other active electronic component. The active surface of the second electronic component 26 may face the second carrier 202 or may be opposite to the second carrier 202. In some embodiments, the second electronic component 26 may be disposed on the second carrier 202 with a die attach film (DAF) 26F and electrically connected to the electronic device 40 by at least a portion of electrical elements 26C electrically connected to the first substrate 10 through the gap G. Another portion of electrical elements 26C may be used to electrically connect the second electronic component 26 to the second carrier 202. The electrical elements 26C may include bonding wires or the like In some embodiments, the electronic package 1 may further include third electronic component(s) 27 disposed on the upper surface 202U of the second carrier 202, and fourth electronic component(s) 28 disposed on a bottom surface 202B of the second carrier 202. The third electronic component(s) 27 and the fourth electronic component(s) 28 each may include active electronic component(s) or passive electronic component(s) and in electrical communication with the first electronic component 44 and/or the second electronic component 26. For example, the third electronic component(s) 27 may include passive electronic component(s) such as capacitor(s), inductor(s), resistor(s) or a combination thereof. In some embodiments, the fourth electronic component(s) 28 may be active electronic component(s) electrically connected to the second carrier 202 by electrical conductors 29 such as solder bumps, conductive pillars, a combination thereof or the like.

The gap G allows a portion of the conductive layer 46 passing through such that the portion of the conductive layer 46 may reach the first substrate 10 and entirely isolate the edge of the electronic device 40 from the second carrier 202, the second electronic component 26, the third electronic component 27 and the fourth electronic component 28. Accordingly, the EMI shielding effect in lateral direction between the electronic device 40 and the second carrier 202, the second electronic component 26, the third electronic component 27 and the fourth electronic component 28 can be improved. The gap G also allows the electrical elements 26C passing through to electrically connect the second electronic component 26 to the first substrate 10. Accordingly, a short and direct electrical transmission path can be created from the second electronic component 26 to the first substrate 10.

In some embodiments, the first carrier 201 of the electronic device 40 and the second carrier 202 may be portions of a second substrate 20. By way of example, the second substrate 20 may include a package substrate such as a core substrate or a coreless substrate with embedded circuitry including conductive wires, conductive pads and/or conductive vias. The second substrate 20 may further include a connect portion 203 connecting the first carrier 201 to the second carrier 202. The first carrier 201, the second carrier 202 and the connect portion 203 may be monolithically formed. In some embodiments, the second electronic component 26 may be electrically connected to the electronic device 40 through the second carrier 202 and the connect portion 203.

The conductive layer 46 may be electrically and thermally conductive such that the conductive layer 46 can provide both EMI shielding and thermal dissipation effect. The material of conductive layer 46 may include metal such as copper, aluminum, stainless steel or the like. The conductive layer 46 may include a conductive lid such as a metal lid. The conductive lid may be a pre-formed structure, and mounted on the first substrate 10 through the gap G after the electronic device 40 is disposed on the first substrate 10. The conductive lid defines an accommodation 46A for accommodating the electronic device 40.

The electronic package 1 may further include an encapsulant 50 encapsulating the conductive layer 46, the electronic device 40, the second carrier 202, the second electronic component 26, third electronic component(s) 27 and the fourth electronic component(s) 28. In some embodiments, the encapsulant 50 may further fill in the accommodation 46A of the conductive lid to encapsulate the first electronic component 44 and the first carrier 201. The encapsulant 50 may include molding compound such as resin, and fillers such as silicon oxide fillers or the like may be filled in the molding compound.

As shown in FIG. 1, FIG. 1A, FIG. 1B and FIG. 1C, the electronic device 40 includes an upper surface 40U, a first edge 40E1, a second edge 40E2, a third edge 40E3 and a fourth edge 40E4. The first edge 40E1 faces the second carrier 202, the second edge 40E2 faces the connect portion 203, the third edge 40E3 is opposite to the first edge 40E1, and a fourth edge 40E4 is opposite to the second edge 40E2. In some embodiments, the above-mentioned first edge 401, second edge 40E2, third edge 40E3 and fourth edge 40E4 may refer to the respective edge of the first electronic component 44, the respective edge of the first carrier 201 and/or the respective edge of the encapsulant 50 in the accommodation 46A. The second carrier 202 is adjacent to the first edge 40E1 of the electronic device 40 and apart from the first edge 40E1 with the gap G. The conductive lid may include a cap 46C and a first sidewall 46S1. The cap 46C covers the upper surface 40U of the electronic device 40, and the first sidewall 46S1 extends from the cap 46C toward the first substrate 10 to cover the first edge 40E1 of the electronic device 40 through the gap G. The cap 46C of the conductive lid is in thermally conductive contact with the upper surface 40U of the electronic device 40. By way of an example, the cap 46C of the conductive lid is in direct contact with the upper surface 40U of the electronic device 40. By way of another example, the cap 46C of the conductive lid is in indirect contact with the upper surface 40U of the electronic device 40 with a portion of the encapsulant 50 and/or a thermal interface material (TIM) interposed therebetween. The cap 46C can provide a short and direct heat dissipation path for the electronic device 40, and thus heat dissipation can be enhanced.

The conductive lid includes an opening 46H at least partially exposing the second edge 402, and the first carrier 201 may be inserted into the accommodation 46A of the conductive lid through the opening 46H. The encapsulant 50 may fill in the accommodation 46A of the conductive lid through the opening 46H to encapsulate the electronic device 40.

In some embodiments of the present disclosure, the electronic package 1 includes the conductive layer 46 for increasing EMI shielding and thermal dissipation effects. The conductive layer 46 passing through the gap G such that the conductive layer 46 may reach the first substrate 10 and entirely isolate the edge of the electronic device 40 from the second carrier 202, the second electronic component 26, the third electronic component 27 and the fourth electronic component 28. Accordingly, the EMI shielding effect in lateral direction between the electronic device 40 and the second carrier 202, the second electronic component 26, the third electronic component 27 and the fourth electronic component 28 can be improved. In addition, the conductive layer 46 further covers the upper surface 40U of the electronic device 40, and thus can provide a short and direct heat dissipation path for the electronic device 40.

The electronic packages and manufacturing methods of the present disclosure are not limited to the above-described embodiments, and may be implemented according to other embodiments. To streamline the description and for the convenience of comparison between various embodiments of the present disclosure, similar components of the following embodiments are marked with same numerals, and may not be redundantly described.

Figure 2:
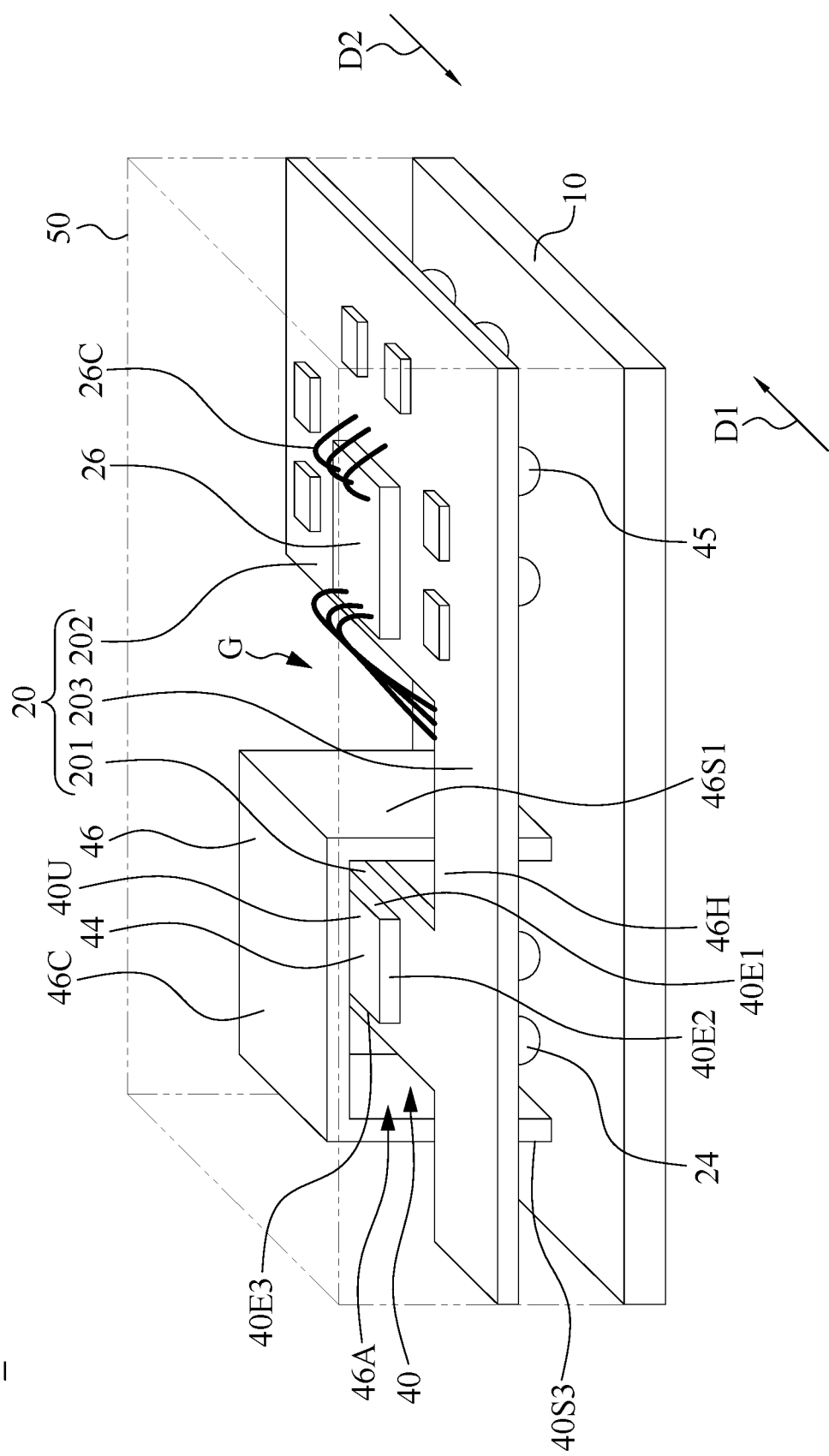
FIG. 2 is a schematic perspective view of an electronic package in accordance with some embodiments of the present disclosure.
Figure 2A:
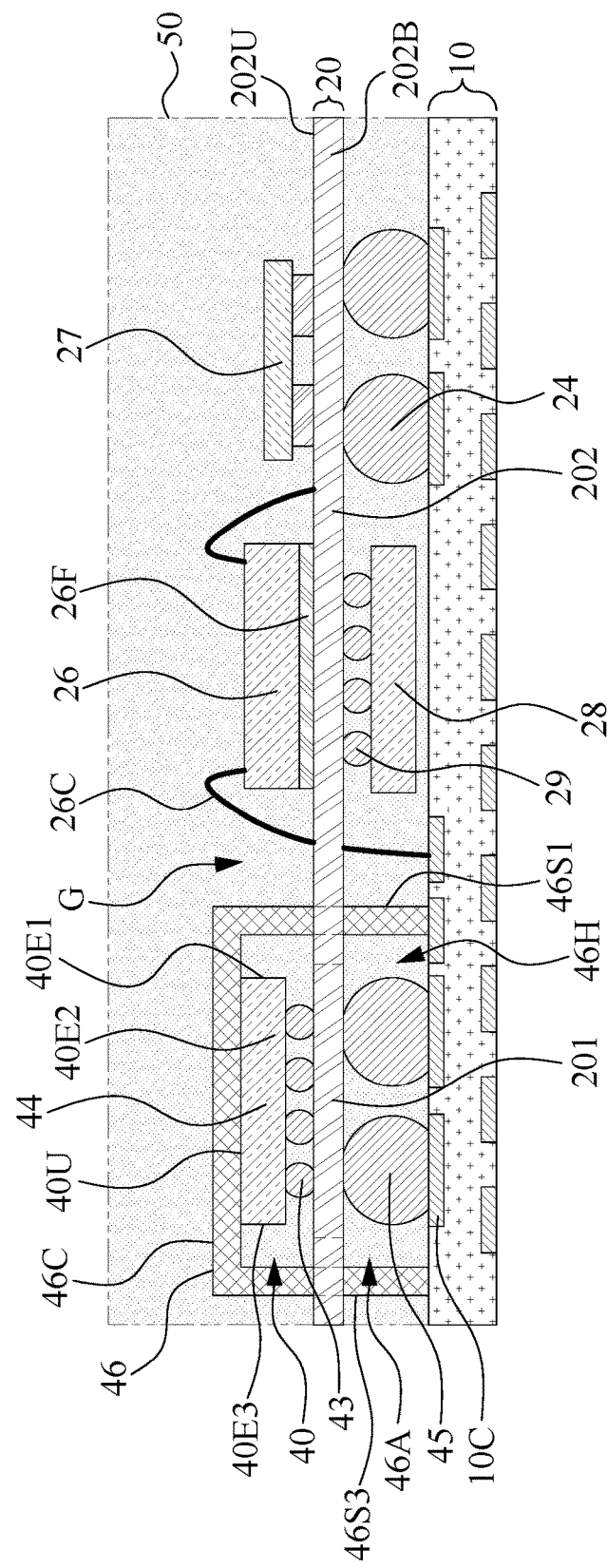
FIG. 2A is a schematic side view of the electronic package from a first direction D1 of FIG. 2.
Figure 2B:
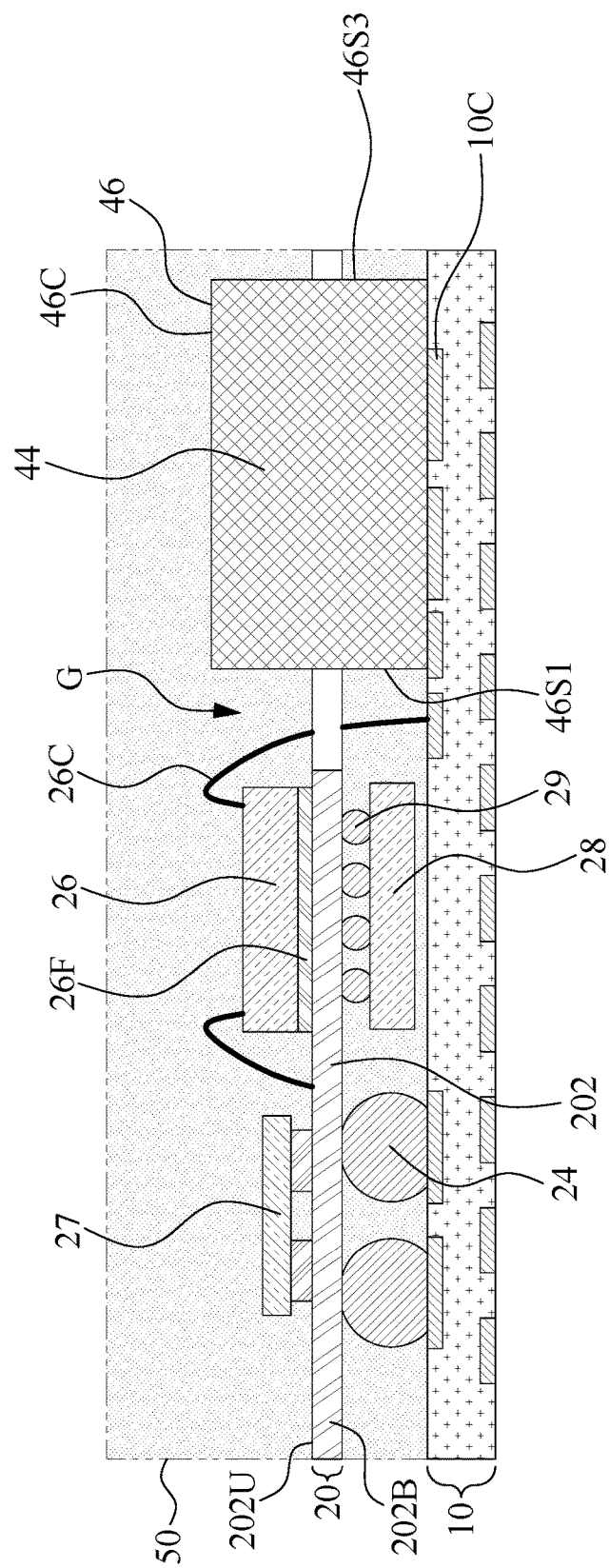
FIG. 2B is a schematic side view of the electronic package from a second direction D2 of FIG. 2.
Figure 2C:
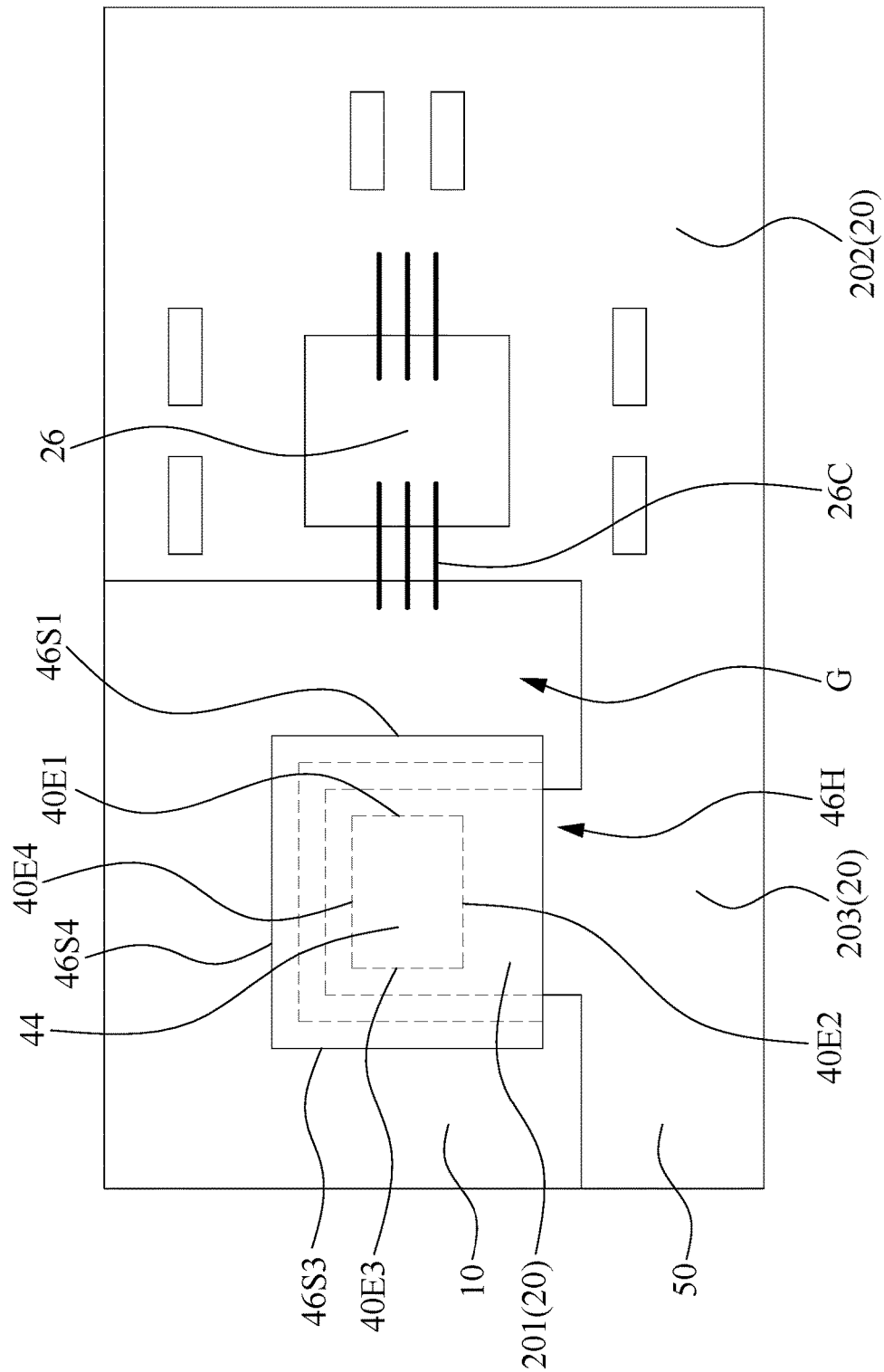
FIG. 2C is a schematic top view of the electronic package of FIG. 2.

FIG. 2 is a schematic perspective view of an electronic package 2 in accordance with some embodiments of the present disclosure, FIG. 2A is a schematic side view of the electronic package 2 from a first direction D1 of FIG. 2, FIG. 2B is a schematic side view of the electronic package 2 from a second direction D2 of FIG. 2, and FIG. 2C is a schematic top view of the electronic package 2 of FIG. 2. To highlight features of the electronic package 1, some component such as an encapsulant is not drawn in FIG. 2C. As shown in FIG. 2, FIG. 2A, FIG. 2B and FIG. 2C, in contrast to the electronic package 1, the conductive lid of the electronic package 2 may further include a third sidewall 46S3 covering the third edge 40E3. The third sidewall 46S3 is opposite to the first sidewall 46S1, and the third sidewall 46S3 and the first sidewall 46S1 may substantially have the same height. The conductive lid of the electronic package 2 may further include a fourth sidewall 46S4 covering the fourth edge 40E4. The fourth sidewall 46S4 is opposite to the opening 46H, and the fourth sidewall 46S4, the third sidewall 46S3 and the first sidewall 46S1 may substantially have the same height. The first sidewall 46S1, the third sidewall 46S3 and the fourth sidewall 46S4 enclose three edges of the electronic device 40, and thus can enhance EMI shielding effect and thermal dissipation effect. The opening 46H allows the encapsulant 50 filling in the accommodation 46A.

Figure 3:
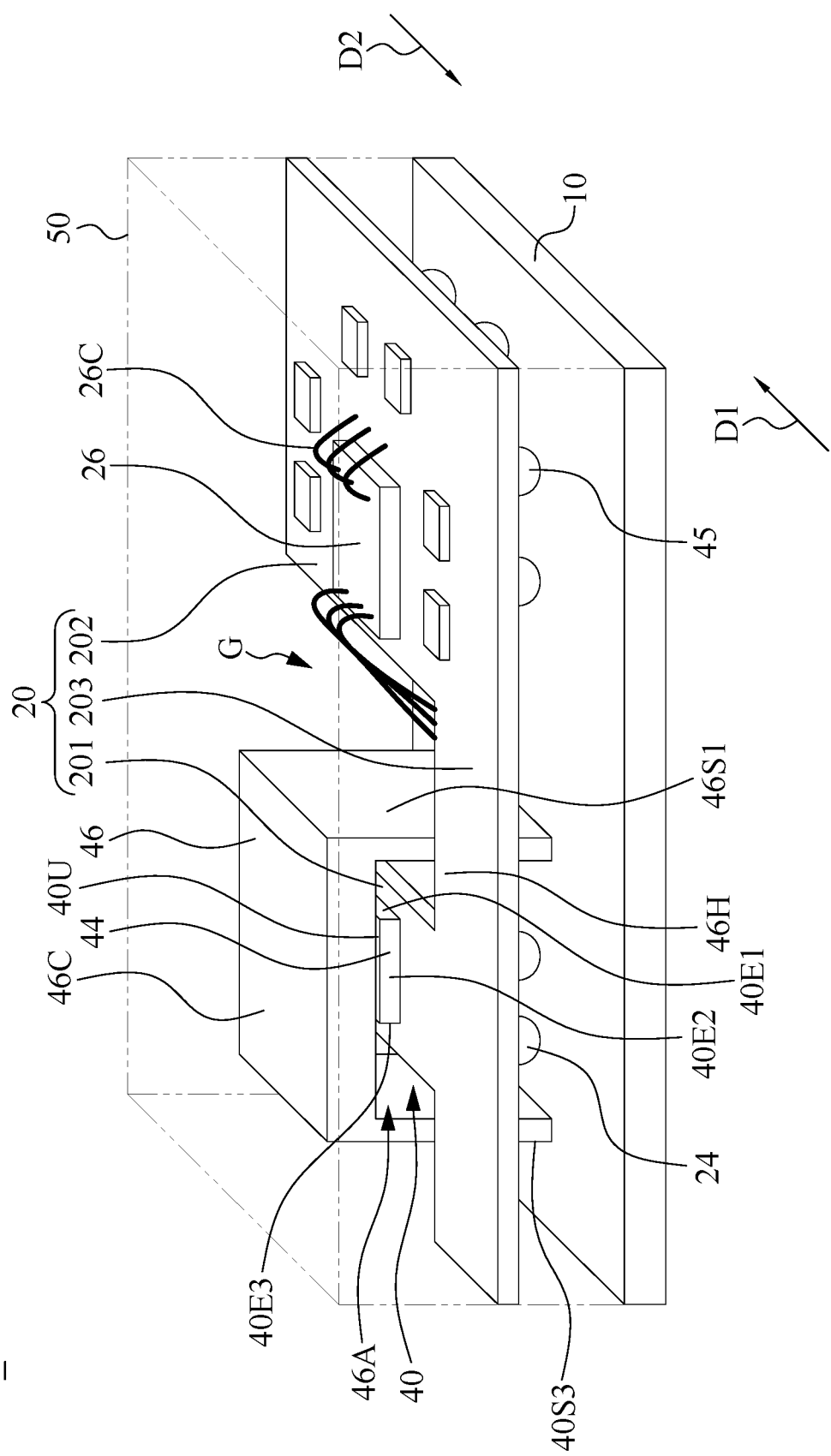
FIG. 3 is a schematic perspective view of an electronic package in accordance with some embodiments of the present disclosure.
Figure 3A:
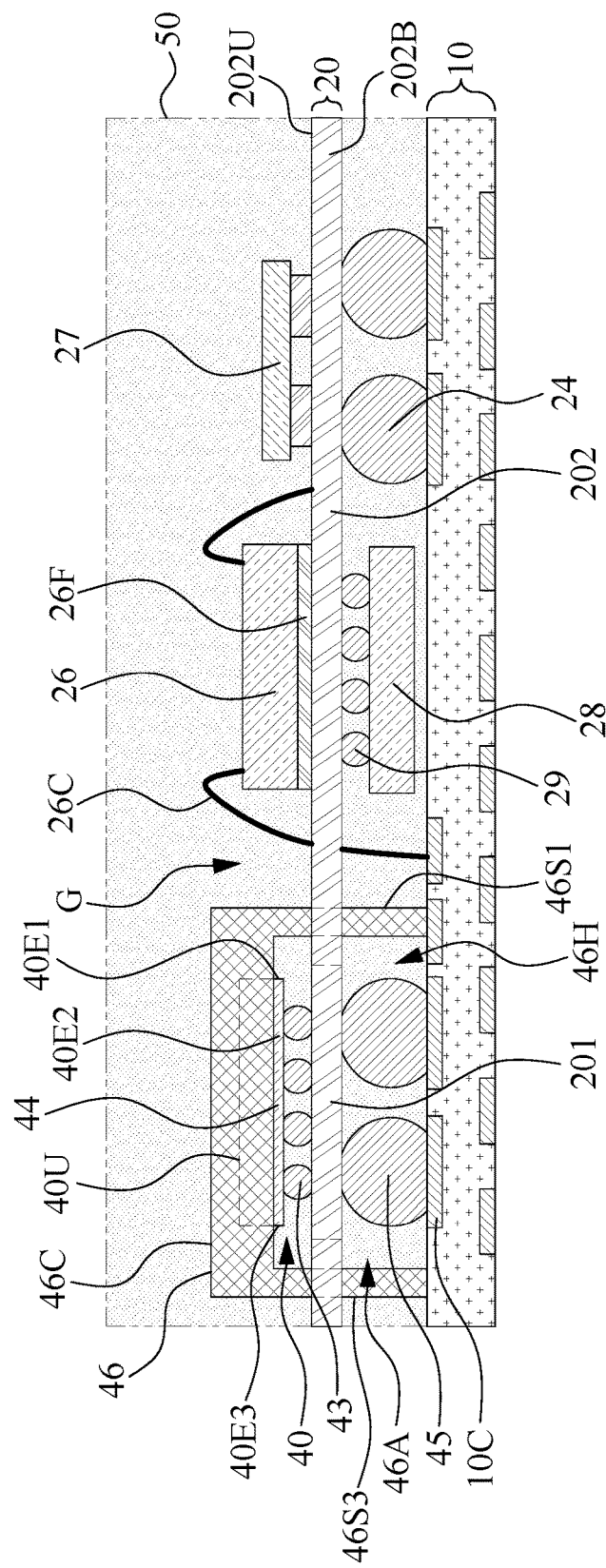
FIG. 3A is a schematic side view of the electronic package from a first direction D1 of FIG. 3.

FIG. 3 is a schematic perspective view of an electronic package 3 in accordance with some embodiments of the present disclosure, and FIG. 3A is a schematic side view of the electronic package 3 from a first direction D1 of FIG. 3. As shown in FIG. 3 and FIG. 3A, in contrast to the electronic package 2, the conductive lid further includes a second sidewall 46S2 partially covering the second edge 40E2. The second sidewall 46S2 is shorter than the first sidewall 46S1. The opening 46H of the electronic package 3 may be smaller than the opening 46H of the electronic package 2. The size of the opening 46H may be such selected that the encapsulant 50 can be filled into the accommodation 46A.

Figure 4:
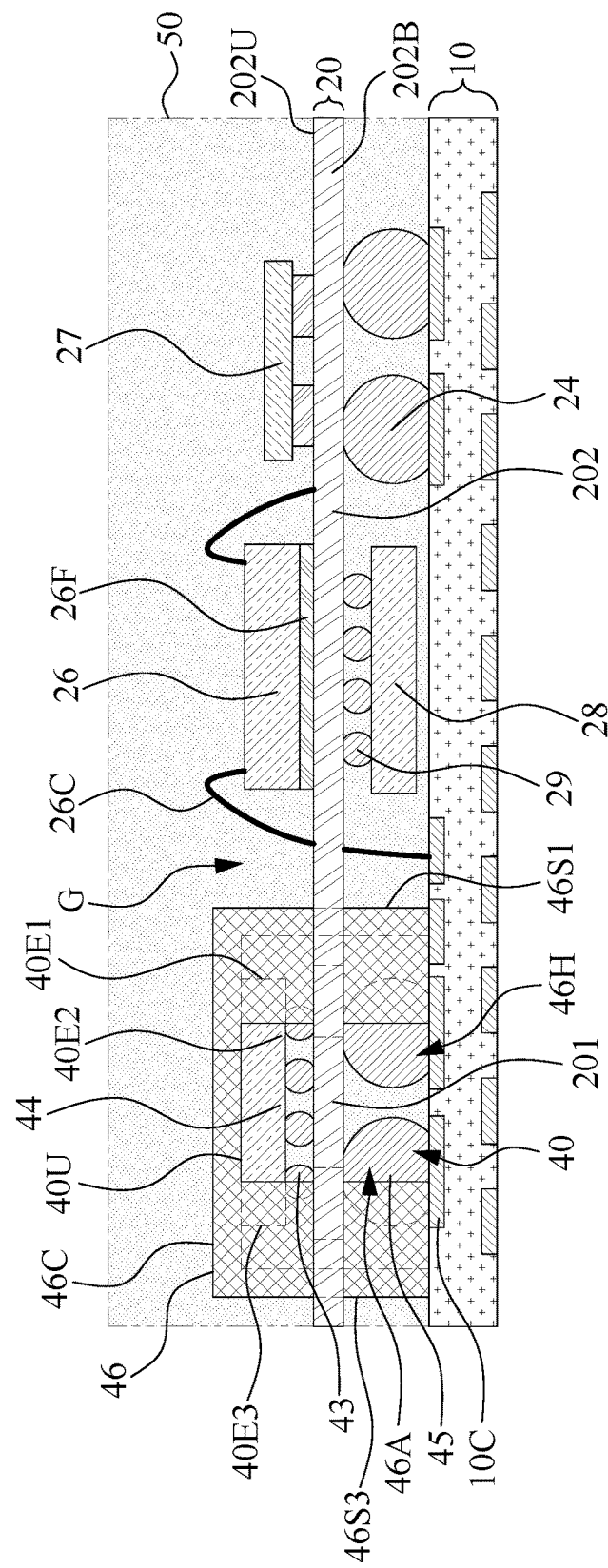
FIG. 4 is a schematic side view of an electronic package in accordance with some embodiments of the present disclosure.

FIG. 4 is a schematic side view of an electronic package 4 in accordance with some embodiments of the present disclosure. As shown in FIG. 4, in contrast to the electronic package 3, the second sidewall 46S2 and the first sidewall 46S1 may have the same height. The second sidewall 46S2 may be divided into two or more pieces with the opening 46H disposed between the two or more pieces.

In some embodiments of the present disclosure, the cap 46C, the first sidewall 46S1, the second sidewall 46S2, the third sidewall 46S3 and/or the fourth sidewall 46S4 may be perforated. The size of the perforations may be such selected that EMI shielding can be kept while the encapsulant 50 can be filled in the accommodation 46A through the perforations.

Figure 5:
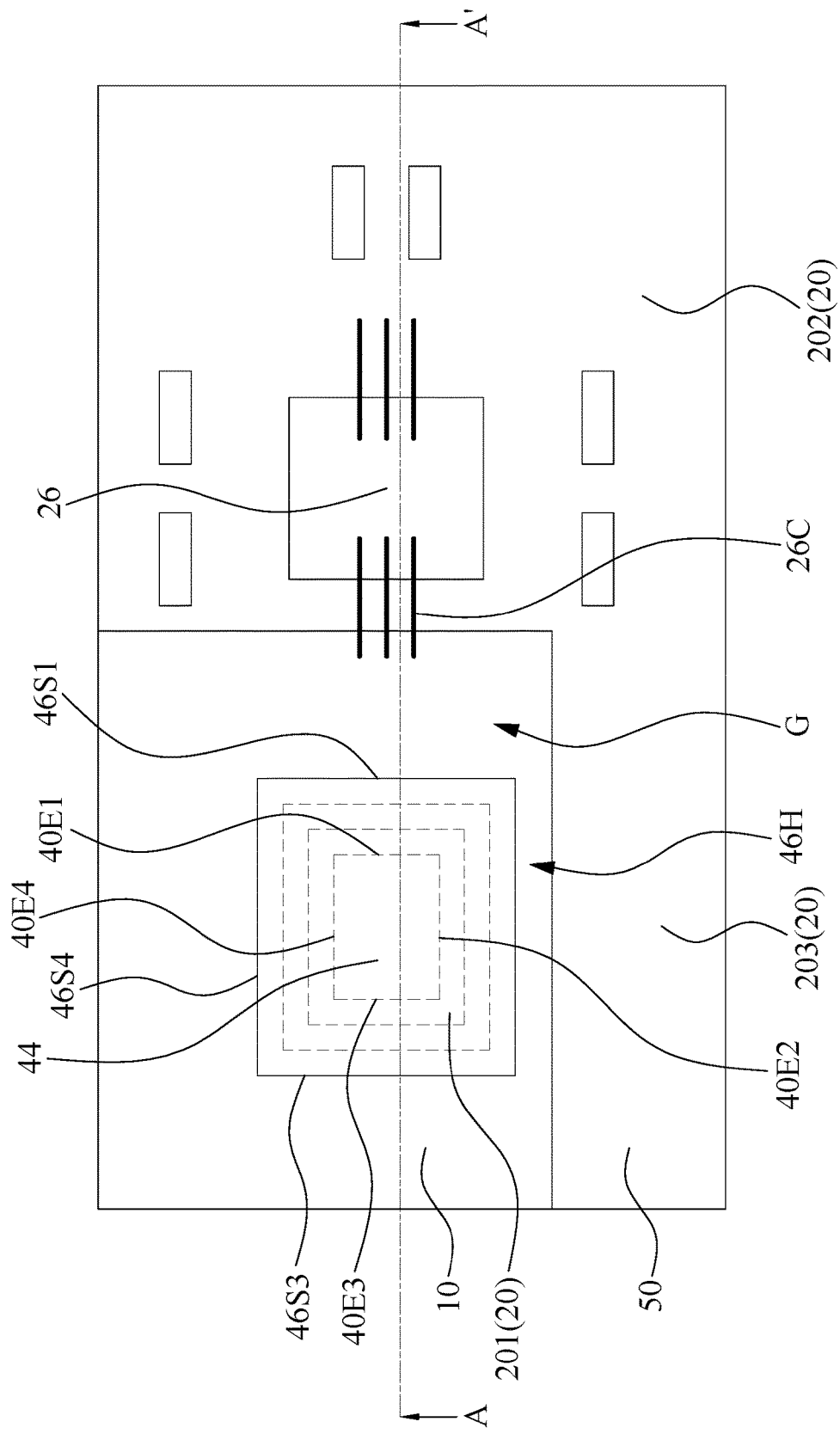
FIG. 5 is a schematic top view of an electronic package in accordance with some embodiments of the present disclosure.
Figure 5A:
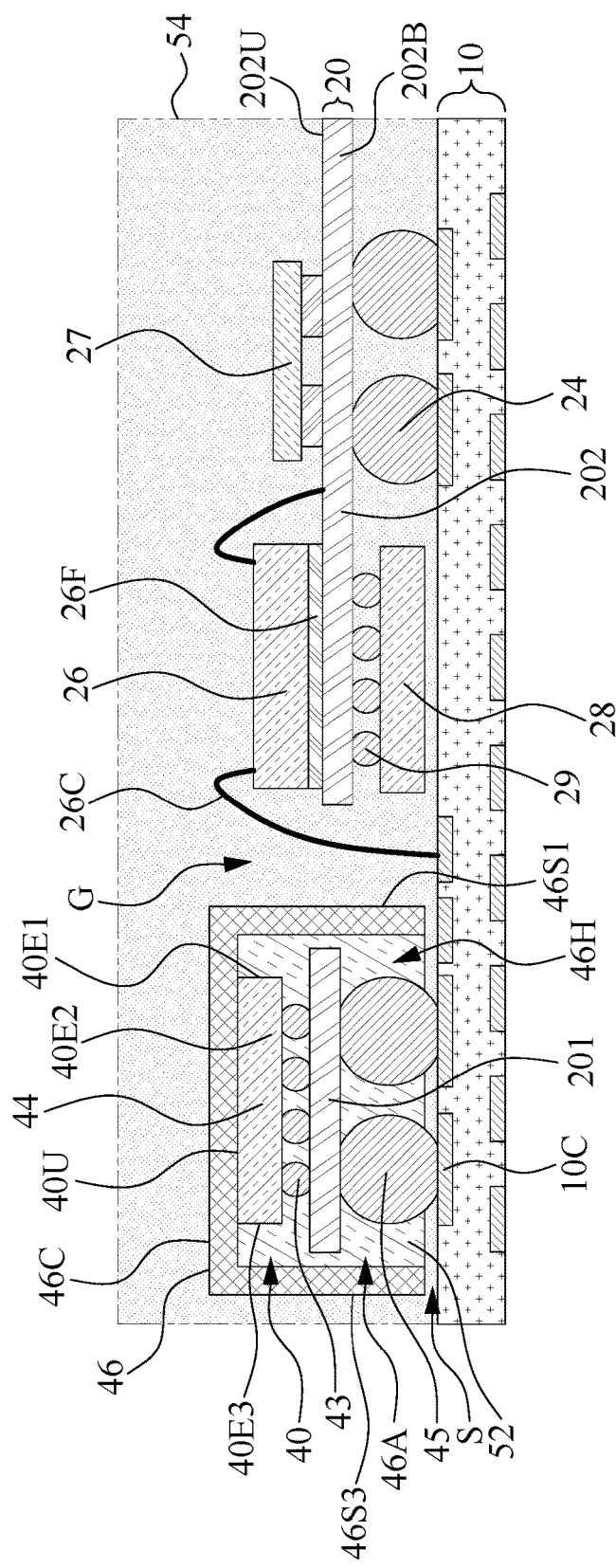
FIG. 5A is a schematic cross-sectional view of the electronic package along a line A-A' of FIG. 5.

FIG. 5 is a schematic top view of an electronic package 5 in accordance with some embodiments of the present disclosure, and FIG. 5A is a schematic cross-sectional view of the electronic package 5 along a line A-A' of FIG. 5. As shown in FIG. 5 and FIG. 5A, in contrast to the electronic packages 1-4, the electronic device 40 of the electronic package 5 includes a sub-package, and the first carrier 201 and the second carrier 202 are two physically separated pieces. The sub-package is a pre-formed package prior to mounting on the first substrate 10. The electronic device 40 may be a sub-package, and thus a first encapsulant 52 may be formed in the accommodation 46A of the conductive lid and encapsulating the electronic device 40 prior to the electronic device 40 is mounted on the first substrate 10. In some embodiments, the electronic device 40 may be mounted on the first substrate 10 in a flip-chip manner electrical with conductors 45, and a space S may exist between the first substrate 10 and the electronic device 40. The first encapsulant 52 may encapsulate the first carrier 201 and the first electronic component 44. The conductive layer 46 may be in contact with the first encapsulant 52. The conductive layer 46 may entirely cover the upper surface 40U and all edges of the electronic device 40, and the opening 46H can be omitted. Accordingly, the EMI shielding effect and thermal dissipation effect can be improved. A second encapsulant 54 different from the first encapsulant 52 may be formed to encapsulate the conductive lid and the second carrier 202. The conductive layer 46 may be in contact with the second encapsulant 54. In some embodiments, the second encapsulant 54 may extend into the space S between the first substrate 10 and the electronic device 40, and encapsulate the conductors 45.

Figure 6A:
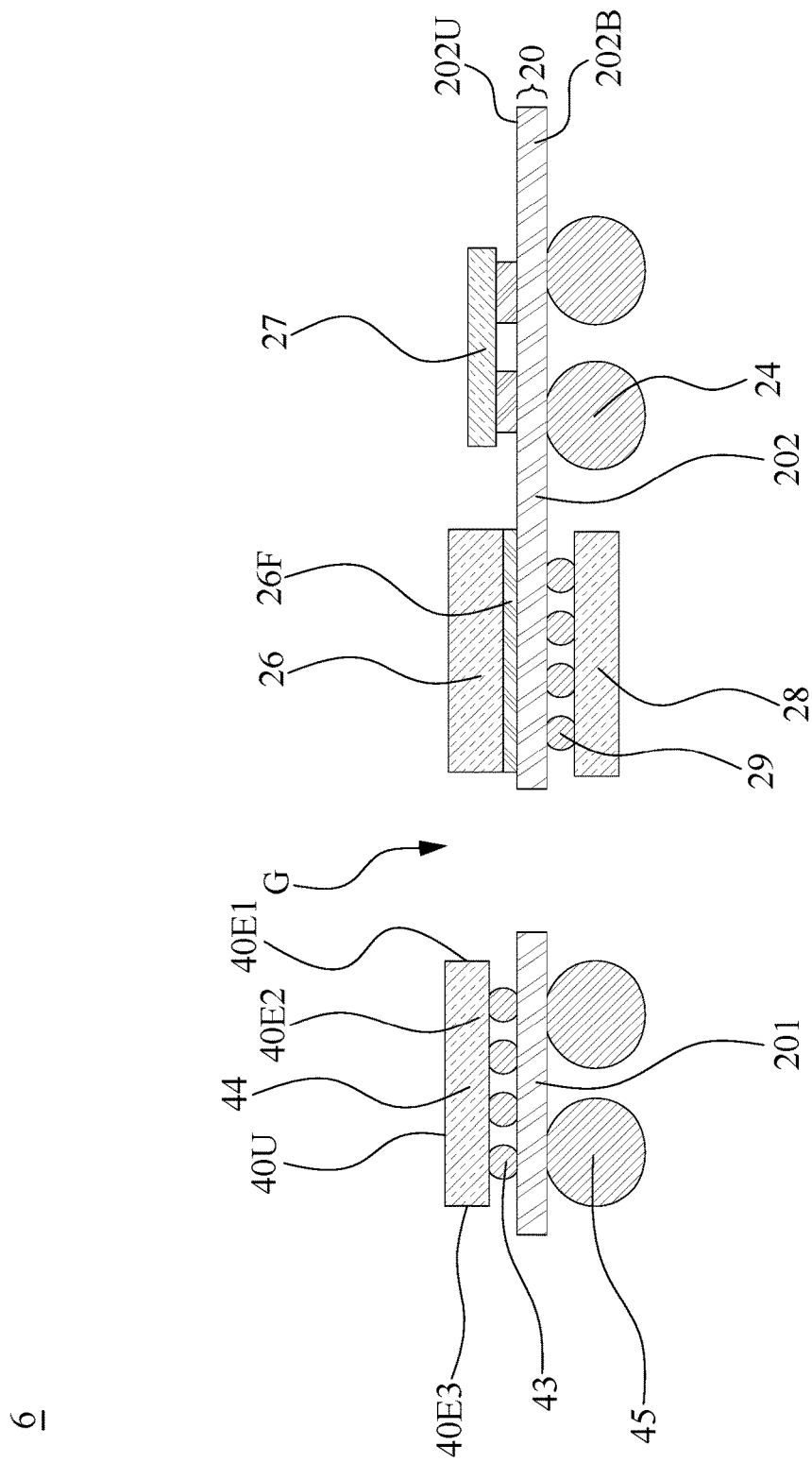
FIG. 6A, FIG. 6B and FIG. 6C illustrate operations of manufacturing an electronic package in accordance with some embodiments of the present disclosure.
Figure 6B:
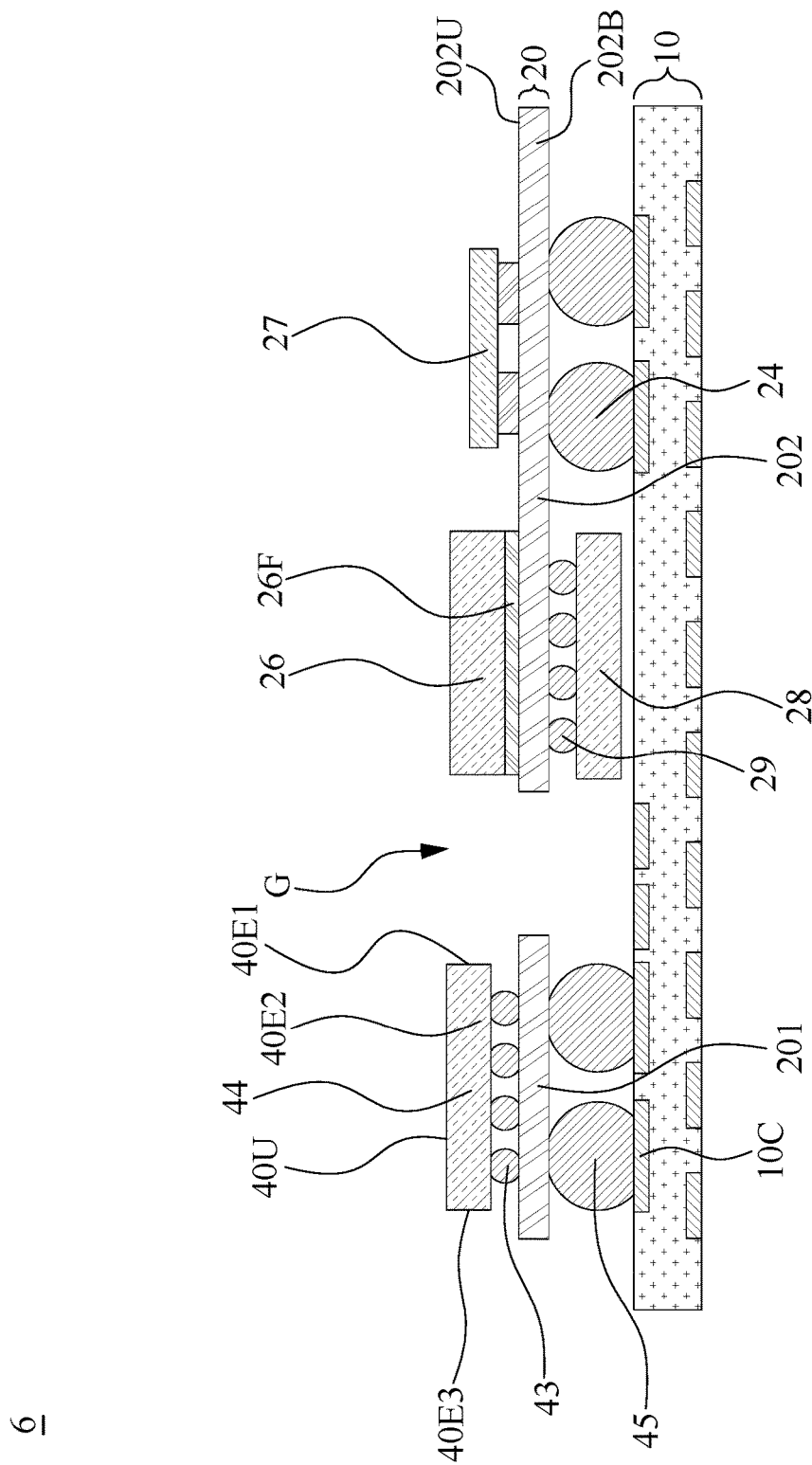
Figure 6C:
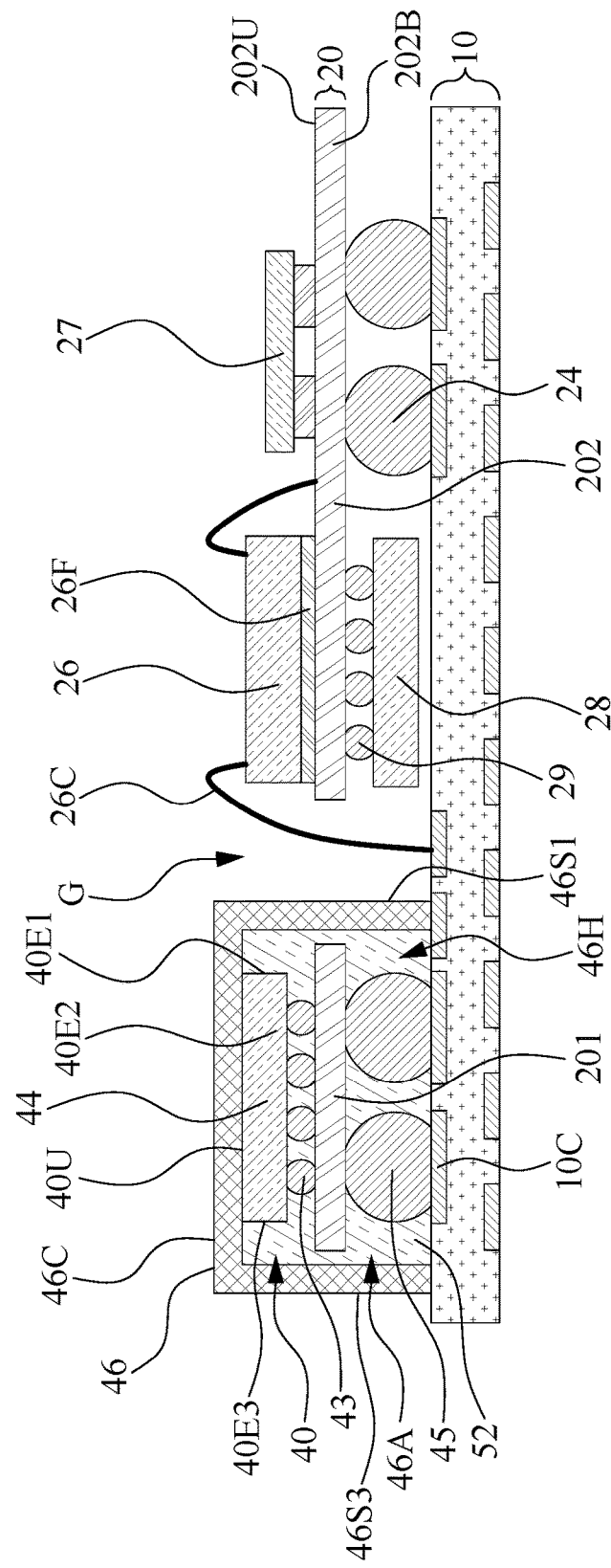

FIG. 6A, FIG. 6B and FIG. 6C illustrate operations of manufacturing an electronic package in accordance with some embodiments of the present disclosure. As shown in FIG. 6A, a carrier such as a second carrier 202 and an electronic device 40 adjacent to the second carrier 202 are provided. In some embodiments, the electronic device 40 includes a first carrier 201 and a first electronic component 44 disposed on the first carrier 201. The first carrier 201 and the second carrier 202 may be portions of a substrate such as a second substrate 20, and monolithically formed. In some embodiments, the first carrier 201 and the second carrier 202 may be separated by a gap G, and connected by a connect portion 203 as shown in FIG. 1. In some embodiments, a second electronic component 26, a third electronic component 27 and/or a fourth electronic component 28 can be formed on the second carrier 202.

As shown in FIG. 6B, the second carrier 202 and the electronic device 40 may be mounted on a substrate such as a first substrate 10 by electrical conductors 24 and 45, respectively. As shown in FIG. 6C, the second electronic component 26 is electrically connected to the first substrate 10 with an electrical element 26C such as a bonding wire 26C through the gap G between the second carrier 202 and the electronic device 40. A conductive layer 46 is formed to cover the electronic device 40 to separate the electronic device 40 from the second carrier 202. The electronic device 40 is thermally conductively contacted with the conductive layer 46 to increase thermal dissipation effect. In some embodiments, the conductive layer 46 may be formed subsequent to the electronic device 40 is mounted on the first substrate 10. The second carrier 202, the electronic device 40 and the conductive layer 46 are encapsulated by an encapsulant 50 to form electronic package 1, 2, 3 or 4 as shown in FIGS. 1-4. The conductive layer 46 may include a conductive lid, and the shape of the conductive lid can be modified to selectively form the electronic package 1, 2, 3 or 4.

Figure 7A:
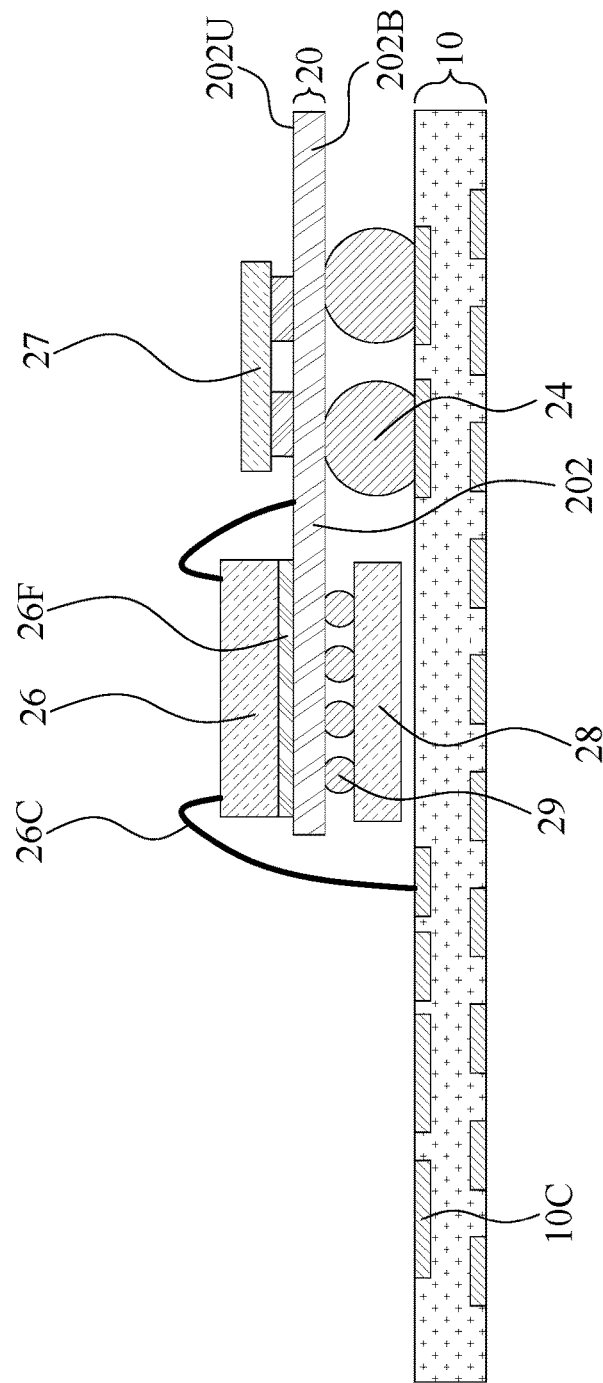
FIGS. 7A and 7B illustrate operations of manufacturing an electronic package in accordance with some embodiments of the present disclosure.
Figure 7B:
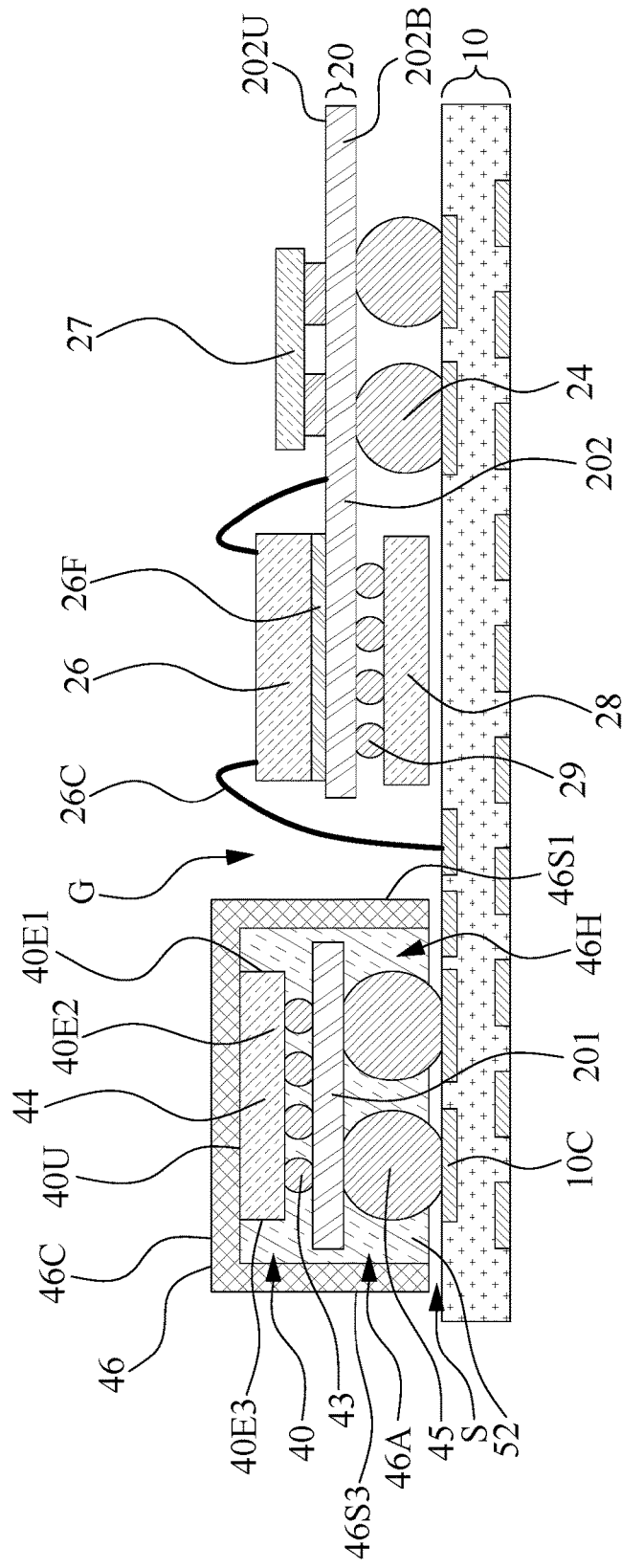

FIGS. 7A and 7B illustrate operations of manufacturing an electronic package in accordance with some embodiments of the present disclosure. As shown in FIG. 7A, a carrier such as a second carrier 202 is provided. In some embodiments, a second electronic component 26, a third electronic component 27 and/or a fourth electronic component 28 can be formed on the second carrier 202. The second carrier 202 may be mounted on a substrate such as a first substrate 10 by electrical conductors 24.

As shown in FIG. 7B, an electronic device 40 is provided and mounted on the first substrate 10 by electrical conductors 45. In some embodiments, the electronic device 40 includes a first carrier 201 and a first electronic component 44 disposed on the first carrier 201. The electronic device 40 may include a sub-package, which is packaged prior to mounting on the first substrate 10. Thus, the electronic device 40 may be encapsulated with a first encapsulant 52 prior to mounting on the first substrate 10. A conductive layer 46 may be formed prior to the electronic device 40 is mounted on the first substrate 10. The conductive layer 46 thus can entirely cover the upper surface 40U and all edges including the first edge 40E1, the second edge 40E2, the third edge 40E3 and the fourth edge 40E4 of the electronic device 40. Accordingly, the EMI shielding effect and thermal dissipation effect can be improved. A second encapsulant 54 may be formed to encapsulate the conductive lid and the second carrier 202 to form the electronic package 5 as shown in FIG. 5 and FIG. 5A.

In some embodiments of the present disclosure, the electronic package is equipped with a conductive lid for increasing EMI shielding and thermal dissipation effects. The electronic package may include a 3D package with a substrate and an electronic device stacked in Z direction. The conductive lid covers an upper surface and at least an edge of the electronic device. The conductive lid is in thermally conductive contact with the upper surface of the electronic device to provide thermal dissipation effect. The conductive layer is interposed between an electronic component of the electronic device and another electronic component to provide EMI shielding effect.

As used herein, the singular terms "a," "an," and "the" may include a plurality of referents unless the context clearly dictates otherwise.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if the difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range were explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein are described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations on the present disclosure.

What is claimed is:

1. An electronic package, comprising:
    a substrate;
    an electronic device disposed over the substrate, wherein the electronic device comprises a first carrier and a first electronic component disposed over the first carrier;
    a second electronic component disposed over the substrate;
    a second carrier separated from the first carrier by a gap, wherein an electrical element passes through the gap to electrically connect the second electronic component to the substrate; and
    a conductive lid passing through the gap and separating the electronic device from the second carrier.

2. The electronic package of claim 1, wherein the electrical element comprises a bonding wire.

3. The electronic package of claim 1, wherein the electrical element is free from directly contacting the first carrier and the second carrier.

4. The electronic package of claim 1, wherein the electrical element extends from a level above an upper surface of the second electronic component, through the gap, and to a level below the second carrier.

5. The electronic package of claim 1, further comprising an encapsulant encapsulating the second electronic component and the electrical element, and disposed within the gap.

* * * * *